United States Patent [19]

Kawashima et al.

[11] Patent Number: 4,644,182
[45] Date of Patent: Feb. 17, 1987

[54] DELAY CIRCUIT HAVING DELAY TIME PERIOD DETERMINED BY DISCHARGING OPERATION

[75] Inventors: Hiromi Kawashima, Kawasaki; Hideki Arakawa, Yokohama, both of Japan

[73] Assignee: Fujitsu Limited, Kawasaki, Japan

[21] Appl. No.: 796,452

[22] Filed: Nov. 8, 1985

[30] Foreign Application Priority Data

Nov. 13, 1984 [JP] Japan .................. 59-237432

[51] Int. Cl.<sup>4</sup> .................... H03K 17/56; H03K 17/687
[52] U.S. Cl. ..................... 307/246; 307/571; 307/605
[58] Field of Search ............ 307/246, 605, 571, 594, 307/570

[56] References Cited

U.S. PATENT DOCUMENTS 3,740,581 6/1973 Pfiffner ..................... 307/570
4,061,929 12/1977 Asano ...................... 307/246
4,529,897 7/1985 Suzaki et al. ................ 307/571

Primary Examiner—Stanley D. Miller
Assistant Examiner—B. P. Davis
Attorney, Agent, or Firm—Armstrong, Nikaido, Marmelstein & Kubovcik

[57] ABSTRACT

A delay circuit including: a P-channel enhancement-type transistor ($Q_{11}$), linked between an input terminal (IN) and an output terminal (OUT); a capacitor (C) connected to the gate of the transistor ($Q_{11}$); a charging switch ($SW_1$) for charging the capacitor (C); a discharging switch ($SW_2$) for discharging the capacitor (C); and a control circuit (CONT) for controlling the charging switch ($SW_1$) and the discharging switch ($SW_2$). The delay time period is determined by the discharging operation of the discharging switch ($SW_1$) after the charging operation of the charging switch ($SW_1$).

5 Claims, 6 Drawing Figures

DELAY CIRCUIT HAVING DELAY TIME PERIOD DETERMINED BY DISCHARGING OPERATION

BACKGROUND OF THE INVENTION (1) Field of the Invention

The present invention relates to a delay circuit in, for example, an electrically erasable and programmable read-only memory (E²PROM), a nonvolatile random access memory (NOVRAM), and the like.

(2) Description of the Related Art

In an E²PROM, NOVRAM, and the like, the write/erase voltage $V_{PP}$ is remarkably higher than the normal power supply voltage $V_{CC}$ (for example, 5 V). Such a write/erase voltage $V_{PP}$ is 20 V to 25 V. In the prior art, this write/erase voltage $V_{PP}$ is supplied from the exterior. However, in recent years, a step-up circuit has been provided in each chip to generate an internal write/erase voltage, thus allowing the external power supplies and external terminals (pads) of the chips to be reduced.

During a write/erase mode, a clock signal is supplied to the step-up circuit, thereby increasing the write/erase voltage $V_{PP}$. As a result, this high voltage $V_{PP}$ is applied to a memory cell to perform a write-erase operation thereupon due to a tunneling effect.

However, such a high voltage $V_{PP}$ rises too rapidly, and the cell to which the write/erase voltage $V_{PP}$ is applied may be destroyed or the life-time thereof shortened due to the application of an excessively large electric field to the tunneling films. To avoid this, a delay circuit is incorporated in a chip for slowing the rise of the write/erase voltage $V_{PP}$. That is, such a delay circuit blunts the waveform of the write/erase voltage $V_{PP}$.

A prior art delay circuit comprises an N-channel depletion-type transistor, linked between a signal input terminal and a signal output terminal, a N-channel depletion-type transistor as a load, and a capacitor C connected to the input terminal, thereby forming a capacitance-resistance (CR) time constant circuit.

However, in the above-mentioned prior art, it is difficult to precisely increase the CR time constant. If the CR time constant is caused to be increased, the manufacturing cost of the circuit is increased, which will be later explained in more detail.

SUMMARY OF THE INVENTION

It is an object of the present invention to provide a delay circuit at a low manufacturing cost having an increased delay time period.

According to the present invention, there is provided a delay circuit comprising: an input terminal means; an output terminal means; a power supply means; a transistor having a gate, a source and a drain, the source and drain being connected between the input terminal means and the output terminal means; a capacitor, linked between the gate of the transistor and the power supply means; a charging switch, linked between the input terminal means and the gate of the transistor, for charging the capacitor; a discharging switch, connected to the gate of the transistor, for discharging the capacitor; a constant current source, linked between the discharging switch and the constant power supply means; and control means, connected to the charging switch and to the discharging switch, for complementarily controlling the charging switch and the discharging switch.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENT

Figure 1:
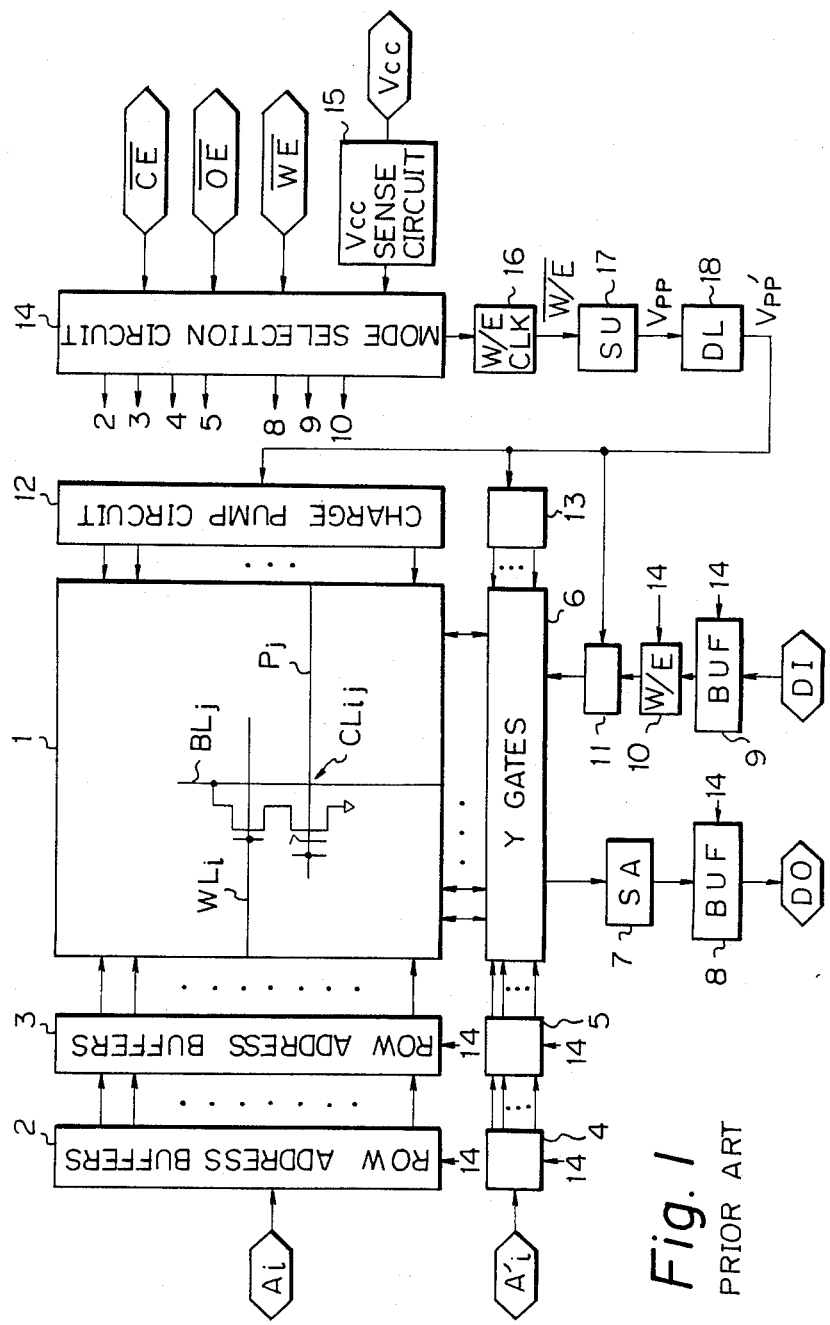
FIG. 1 is a block circuit diagram schematically illustrating all of an E²PROM to which the present invention applies.

First, an example of an E²PROM will be explained with reference to FIG. 1. In FIG. 1, reference numeral 1 designates a memory cell array including memory cells. For example, a memory cell $CL_{ij}$ is provided at an intersection between a word line $W_i$ and a bit line $BL_j$. $P_j$ designates a program line. Reference numeral 2 designates row address buffers each receiving an X-address signal $A_i$ (i=0 to n); 3 row address decoders; 4 column address buffers each for receiving a Y-address signal $A_i'$ (i=0 to n); 5 column address decoders; and 6 Y-gates. Output data is transmitted from the Y-gates 6 via a sense amplifier 7 and an output data buffer 8 to an output terminal DO, and input data is supplied from an input terminal DI via an input data buffer/latch circuit 9, a write/erase control circuit 10, and a charge pump circuit 11 to the Y-gates 6.

Reference numeral 14 designates a mode selection circuit for receiving a chip-enable signal $\overline{CE}$, a write-enable signal $\overline{WE}$, an output-enable signal $\overline{OE}$, and the like, so as to select an operation mode. That is, the mode selection circuit 14 controls the elements 2, 3, 4, 5, 8, 9, and 10, in accordance with the signal $\overline{CE}$, $\overline{WE}$, $\overline{OE}$, and the like.

Also, a single power supply voltage $V_{CC}$ is supplied via a power supply voltage sense circuit 15 to the mode selection circuit 14. This, the memory cell array 1 is operated only when the power supply voltage $V_{CC}$ is higher than a predetermined value, such as 3.5 V.

Reference numeral 16 designates a clock generating circuit which generates a write/erase clock signal W/E when a write/erase operation is carried out.

Reference numeral 17 designates a step-up circuit which generates a high voltage $V_{PP}$ during a write/erase mode (W/E="1"), and 18 designates a delay circuit. That is, the high voltage of the step-up circuit 17 is supplied via the delay circuit 18 to each of the charge pump circuits 11, 12 and 13. In this case, the high voltage $V_{PP}$ of the step-up circuit 17 is relaxed by the delay circuit 18, and the relaxed high voltage $V_{PP}'$ is applied to the bit line $B_j$ or the program line $P_j$ of a cell.

A writing operation for the memory cell $CL_{ij}$ is carried out by applying a high voltage (20 V to 25 V) to the word line $WL_i$ and to the bit line $BL_j$. An erasing operation for the memory cell $CL_{ij}$ is carried out by applying a high voltage (20 V to 25 V) to the word line $WL_i$ and to the program line $P_j$. Generally, in an E²PROM, note that a "writing operation" is to write data "0" into a cell, and an "erasing operation" is to write data "1" into a cell. The read operation for the memory cell $C_{ij}$ is carried out by applying a power supply voltage $V_{CC}$ (=5 V) to the word line $WL_i$ and applying a predetermined bias voltage (about 2 V) to the program line $P_j$.

Figure 2:
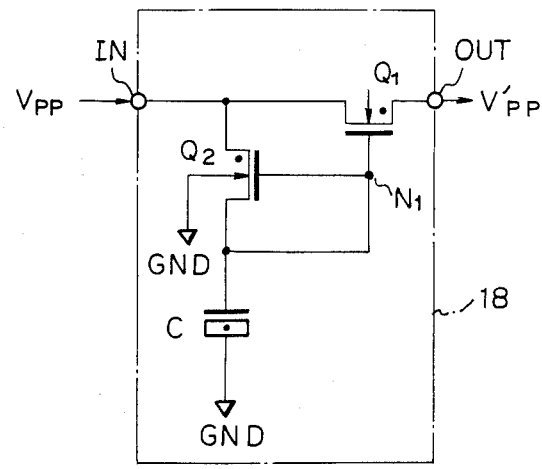
FIG. 2 is a circuit diagram of a prior art delay circuits.

In FIG. 2, which illustrates a prior art delay circuit, an N-channel depletion-type transistor $Q_1$ is linked between a signal input terminal IN and a signal output terminal OUT, and an N-channel depletion-type transistor $Q_2$ as a load and a capacitor C are connected to the input terminal IN, thereby forming a CR time constant circuit.

In FIG. 2, however, it is very difficult to precisely increase the time constant CR, which will be explained below. That is, when the potential at node $N_1$ increases, the current flowing through the transistor $Q_2$ decreases. In other words, the R component of the CR time constant is changed in accordance with the elapsed time. Therefore, in order to obtain a desired output waveform, the delay circuit 18 must be designed by taking into consideration the back bias effect of the threshold voltage $V_{th}$ of the transistor $Q_2$, so that it is difficult to obtain a precise CR time constant. In order to relax the back bias effect, the threshold voltage $V_{th}$ of the transistor $Q_2$ is further reduced, and as a result, even when this threshold voltage $V_{th}$ is increased due to the back bias effect, the current flowing through the transistor $Q_2$ is not decreased. However, for this purpose, it is necessary to perform an additional ion implantation upon the channel area of the transistor $Q_2$, thereby reducing the threshold voltage $V_{th}$ thereof.

On the other hand, in order to increase the CR time constant, the area of the capacitor C is increased, or the resistance of the transistor $Q_2$ is increased. The increase of the area of the capacitor C is disadvantageous, since the area occupied by the capacitor C is large.

Further, in order to increase the resistance of the transistor $Q_2$, its channel width W is reduced, or its channel length L is increased. The increase of the channel length L is disadvantageous in that it increases the occupied area.

Therefore, in the prior art, the above-mentioned increase of the CR time constant is mainly attained by decreasing the channel width W of the transistor $Q_2$. However, the decrease of the channel width W invites the back bias effect. That is, in a depletion type transistor, the conductivity type of the channel region is opposite to that of a channel cut (stopper) region under a field area, and accordingly, the concentration of impurities of each region near their boundary is reduced. Therefore, in order to compensate for the reduction of the impurity concentration of each region, additional ion implantation and a mask therefor are necessary. Therefore, the manufacturing process in view of the back bias effect invites a high manufacturing cost.

Thus, in the delay circuit of FIG. 2, it is difficult to precisely increase the CR time constant without inviting a high manufacturing cost.

Figure 3:
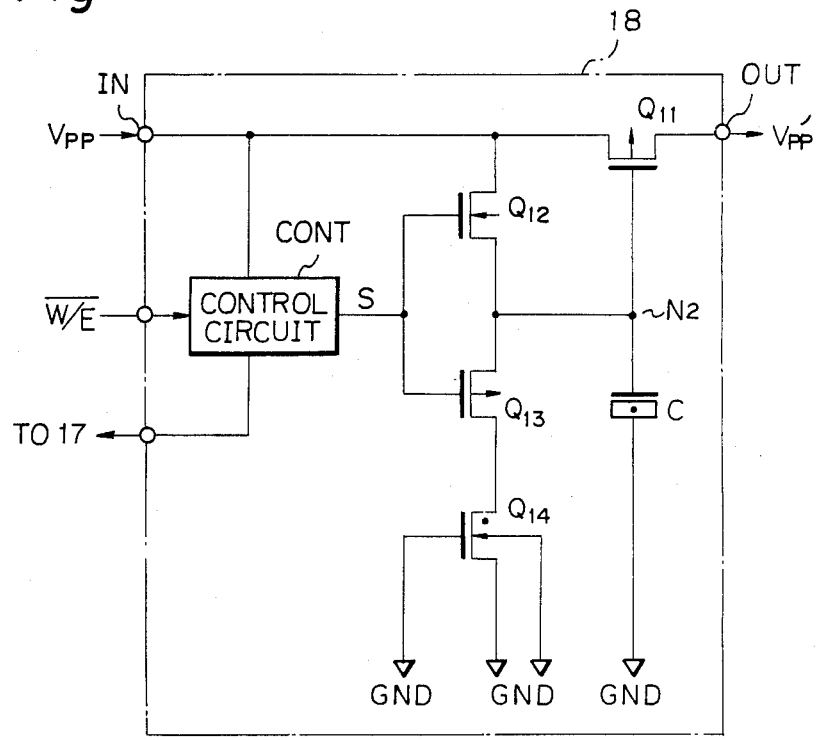
FIG. 3 is a circuit diagram of an embodiment of the delay circuit according to the present invention.

In FIG. 3, which illustrates an embodiment of the tween node $N_1$ and the GND terminal are the P-channel enhancement-type transistor $Q_{13}$ and an N-channel depletion-type transistor $Q_{14}$. The gate and source of this transistor $Q_{14}$ are coupled, and therefore, this transistor serves as a resistor. The gate of the N-channel transistor $Q_{12}$ and the gate of the P-channel transistor $Q_{13}$ are controlled commonly by a control circuit CONT. That is, when the output signal S of the control circuit CONT is high, the transistor $Q_{12}$ is turned ON, thereby charging the capacitor C, and when the output signal S of the control circuit CONT is low, the transistor $Q_{13}$ is turned ON, thereby discharging the capacitor C.

Figure 4:
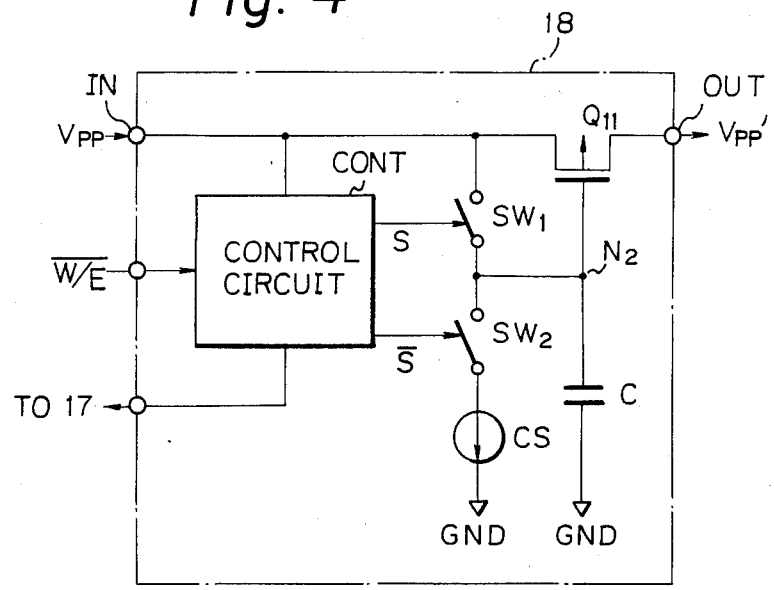
FIG. 4 is an equivalent circuit diagram of the circuit of FIG. 3.

Referring to FIG. 4, which is an equivalent diagram of FIG. 3, the transistor $Q_{12}$ of FIG. 3 corresponds to a switch $SW_1$, and the transistor $Q_{14}$ corresponds to a constant current source CS. Thus, the above-mentioned operation can be clearly understood from the equivalent circuit diagram of FIG. 4.

Figure 5:
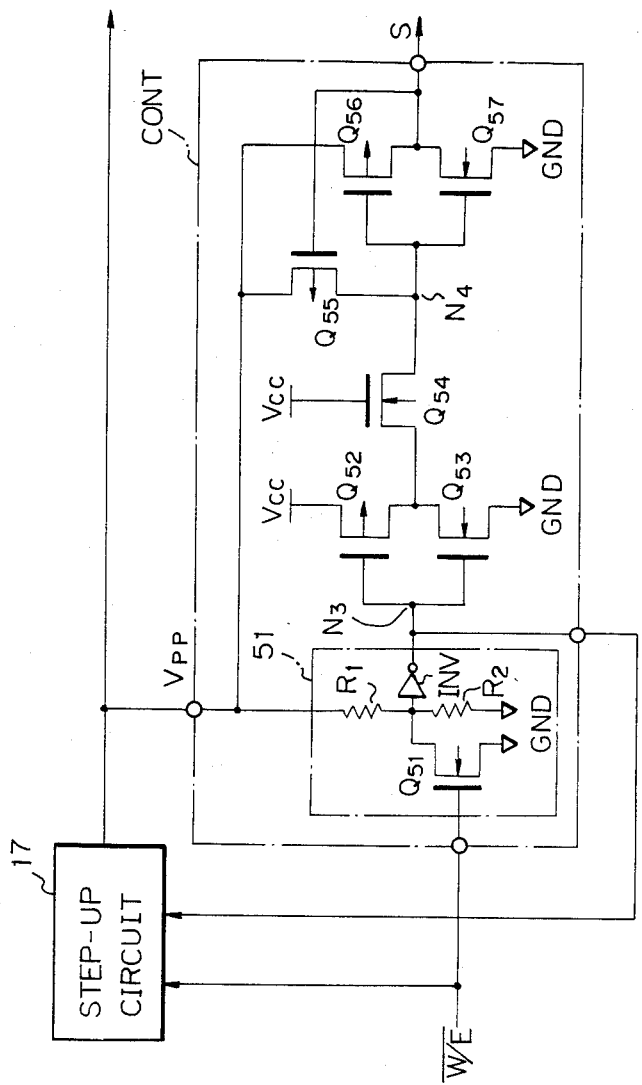
FIG. 5 is a detailed circuit diagram of the control circuit of FIG. 3.

In FIG. 5, which is a detailed circuit diagram of the control circuit CNT of FIG. 3, a voltage detecting circuit 51 comprises a voltage divider formed by resistors $R_1$ and $R_2$, an inverter INV, and an N-channel enhancement-type transistor $Q_{51}$ for receiving a write/erase clock signal $\overline{W/E}$. That is, the voltage detecting circuit 51 is operated at a write/erase mode (W/E="1").

During a write/erase mode, the voltage detecting circuit 51 transmits a low level signal to the node $N_3$ when the voltage $V_{PP}$ of the step-up circuit 17 exceeds a definite level determined by the inverter INV, otherwise, the circuit 51 transmits a high level signal to the node $N_3$. Further, when the potential at the node $N_3$ is low, the step-up circuit 17 is stopped, and when the potential at the node $N_3$ is high, the step-up circuit 17 is operated. References $Q_{52}$ and $Q_{53}$ designate transistors forming an inverter; $Q_{54}$ a transistor as a transfer gate; $Q_{55}$ a transistor for the feedback control; and $Q_{56}$ and $Q_{57}$ transistors forming an inverter.

Figure 6:
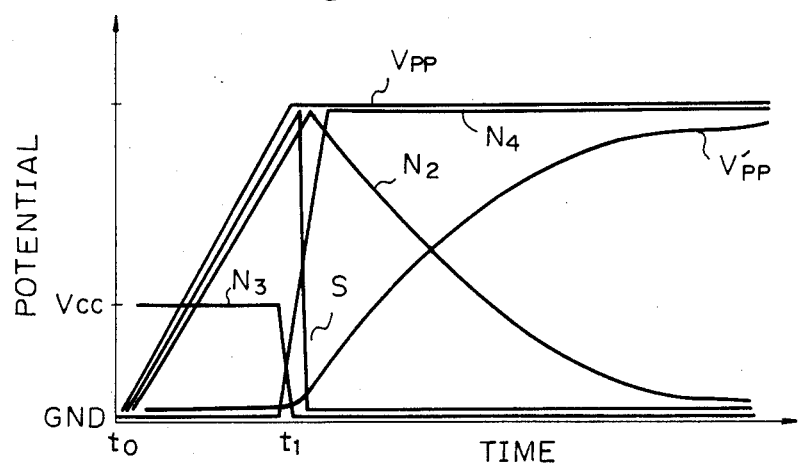
FIG. 6 is a timing diagram showing the operation of the circuit of FIG. 3.

The operation of the circuit of FIG. 3, (FIG. 5) will be explained with reference to FIG. 6. At time $t_0$, the potential $V_{PP}$ rises. The voltage detecting circuit 51 generates a high level output before the potential exceeds the definite level (from $t_0$ to $t_1$), and accordingly, the potential at the node $N_3$ is high. Therefore, for this period, the transistor $Q_{12}$ is turned ON, and as a result, the capacitor C is charged, thereby increasing the potential at the node $N_3$. Therefore, in this state, the P-channel transistor $Q_{11}$ is in a cut-off state, and as a result, the potential at the output terminal OUT remains at a low level.

At time $t_1$, the output of the voltage detecting circuit 51, i.e., the potential at the node $N_3$ is changed from high to low, so that the potential of the signal S is rapidly decreased. Therefore, the transistor $Q_{12}$ is turned OFF, and instead, the transistor $Q_{13}$ is turned ON. As a result, the charges of the capacitor C are discharged by the transistor $Q_{13}$ and the depletion-type transistor $Q_{14}$ as a resistor, thus gradually decreasing the potential at the node $N_2$. The decrease of the potential at the node $N_2$ increase the conductivity of the transistor $Q_{11}$, and accordingly, the potential $V_{PP}'$ rises in accordance with Note that the delay circuit according to the present invention can be also applied to devices other than nonvolatile semiconductor memory devices. Also, various modifications of the control circuit CONT are possible in accordance with the applied devices.

As explained above, the manufacturing process in view of the back bias effect is unnecessary, and accordingly, the present invention is helpful in avoiding fluctuations in the manufacturing process, reducing manufacturing costs, and the computation of an accurate delay time period.

We claim:

1. A delay circuit comprising:
   an input terminal means (IN);
   an output terminal means (OUT);
   a power supply means (GND);
   a transistor ($Q_{11}$) having a gate, a source and a drain, said source and drain being connected between said input terminal means (IN) and said output terminal means (OUT);
   a capacitor (C), connected between the gate of said transistor ($Q_{11}$) and said power supply means (GND);
   a charging switch ($SW_1$), connected between said input terminal means (IN) and the gate of said transistor ($Q_{11}$), for charging said capacitor (C);
   a discharging switch ($SW_2$), connected to the gate of said transistor ($Q_{11}$), for discharging said capacitor (C);
   a constant current source (CS), connected between said discharging switch ($SW_2$) and said power supply means (GND); and
   control means (CONT), connected to said charging switch ($SW_1$) and to said discharging switch ($SW_2$), for complementarily controlling said charging switch ($SW_1$) and said discharging switch ($SW_2$).

2. A circuit as set forth in claim 1, wherein said transistor ($Q_{11}$) is of a P-channel type, and said charging switch ($SW_1$) comprises an N-channel enhancement-type transistor ($Q_{12}$).

3. A circuit as set forth in claim 1, wherein said discharging switch ($SW_2$) comprises a P-channel enhancement-type transistor ($Q_{13}$).

4. A circuit as set forth in claim 1, wherein said constant current source (CS) comprises an N-channel depletion-type transistor having a source connected to the gate thereof.

5. A circuit as set forth in claim 1, wherein said control means (CONT) turns on said charging switch ($SW_1$) and turns off said discharging switch ($SW_2$) when the potential at said input terminal means (IN) is lower than a predetermined value, and said control means (CONT) turns off said charging switch ($SW_1$) and turns on said discharging switch ($SW_2$) when the potential at said input terminal means (IN) is not lower than said predetermined value.

* * * * *